United States Patent
Lambrecht et al.

(10) Patent No.: US 11,688,675 B1
(45) Date of Patent: Jun. 27, 2023

(54) CORE CAVITY NOISE ISOLATION STRUCTURE FOR USE IN CHIP PACKAGES

(71) Applicant: XILINX, INC., San Jose, CA (US)

(72) Inventors: Frank Peter Lambrecht, San Jose, CA (US); Po-Wei Chiu, Hsinchu (TW); Hong Shi, Los Gatos, CA (US)

(73) Assignee: XILINX, INC., San Jose, CA (US)

( * ) Notice: Subject to any disclaimer, the term of this patent is extended or adjusted under 35 U.S.C. 154(b) by 42 days.

(21) Appl. No.: 17/315,229

(22) Filed: May 7, 2021

(51) Int. Cl.
*H01L 23/498* (2006.01)
*H01L 21/48* (2006.01)
*H01L 23/552* (2006.01)

(52) U.S. Cl.
CPC .... *H01L 23/49822* (2013.01); *H01L 21/4857* (2013.01); *H01L 23/49816* (2013.01); *H01L 23/49838* (2013.01); *H01L 23/552* (2013.01)

(58) Field of Classification Search
CPC .................. H01L 23/49822; H01L 21/4857
See application file for complete search history.

(56) References Cited

U.S. PATENT DOCUMENTS 6,515,361 B2    2/2003   Lee et al.
2022/0199538 A1 *   6/2022   Lu ........................ H01L 23/5383

FOREIGN PATENT DOCUMENTS

CN      105097656 A   *   11/2015

\* cited by examiner

*Primary Examiner* — Selim U Ahmed
*Assistant Examiner* — Evan G Clinton
(74) *Attorney, Agent, or Firm* — Patterson + Sheridan, LLP (57) ABSTRACT

Various noise isolation structures and methods for fabricating the same are presented. In one example, a substrate for chip package is provided. The substrate includes a core region, top build-up layers and bottom build-up layers. The top build-up layers are formed on a first side of the core region and the bottom build-up layers are formed on a second side of the core region that is opposite the first side. Routing circuitry formed in the bottom build-up layers is coupled to routing circuitry formed in the top build-up layers by vias formed through the core region. A void is formed in the bottom build-up layers. The void is configured as a noise isolation structure. The void has a sectional area that is different in at least two different distances from the core region.

17 Claims, 10 Drawing Sheets

CORE CAVITY NOISE ISOLATION STRUCTURE FOR USE IN CHIP PACKAGES

TECHNICAL FIELD

Embodiments of the present invention generally relate to thick core packaging, and in particular to a core cavity noise isolation structure for chip packages.

BACKGROUND

A ball grid array (BGA) in chip packages has fringe parasitic capacitance to planar structures. This causes impedance mismatch and high return loss and/or reflections. To mitigate this problem, BGA vertical ground relief structures have been included above the BGA. The inclusion of such relief structures has helped to meet return loss characteristics of multiple Ethernet signaling and other high speed standards.

However as speeds increase, new coupling mechanisms effect the impedance mismatch and return loss. The void directly below the core of the package allows electromagnetic energy to couple out of signal nets and into the cavity structure. This effect is exacerbated when a thicker core is used, and thus, thick core manufacturing techniques worsen the problem due to this larger core thickness. However, the use of thick cores is a significant cost saver for integrated circuit (IC) packages and is thus highly desired. Thick cores also contribute to mechanical reliability in very large packages.

What is needed is a design for a thick core mitigates the problems of high frequency electromagnetic energy leakage into a chip cavity.

SUMMARY

Various noise isolation structures and methods for fabricating the same are presented. In one example, a substrate for chip package is provided. The substrate includes a core region, top build-up layers and bottom build-up layers. The top build-up layers are formed on a first side of the core region and the bottom build-up layers are formed on a second side of the core region that is opposite the first side. Routing circuitry formed in the bottom build-up layers is coupled to routing circuitry formed in the top build-up layers by vias formed through the core region. A void is formed in the bottom build-up layers. The void is configured as a noise isolation structure. The void has a sectional area that is different in at least two different distances from the core region.

In another example, a chip package is provided. The chip package includes an integrated circuit die mounted to a substrate. The substrate has top and bottom build-up layers disposed on opposite sides of a core region. The substrate has a void formed in the bottom build-up layers. The void is configured as a noise isolation structure. The void has a sectional area that is different in at least two different distances from the core region.

In yet another example, a method for forming a chip package or component thereof is provided. The method includes forming build-up layers on opposite sides of a core region of a substrate; and forming multi-layer relief structures in the build-up layers of the substrate that is configured to be coupled to balls of a ball grid array. At least one of the multi-layer relief structures has a sectional area that is different closer to the core region, and functions as a noise isolation structure.

In another example, a noise isolation structure includes a void provided at the bottom of a thick core package cavity, the void comprising a plurality of N layers, each layer provided with an opening, and the void provided above a ball of a ball grid array (BGA). The noise isolation structure is further configured such that a top layer of the plurality of layers has a smaller opening than a bottom layer of the plurality of layers.

In one example, the top layer of the void has an opening of a first size, the bottom layer of the void has an opening of a second size, and the second size is double the first size.

In another example, a method of providing a noise isolation structure is described. The method includes providing a void at the bottom of a thick core package cavity, the void comprising a plurality of N layers, each layer provided with an opening, the void provided above a ball of a BGA. The method further includes configuring a top layer of the plurality of layers to have a smaller opening than one or more bottom layers of the plurality of layers.

In still another example, a method of providing a noise isolation structure is described. The method includes providing a chip package with a thick core cavity and a BGA below the thick core cavity. The method further includes providing multi-layer relief structures between balls of the BGA and the thick core cavity, the multi-layer relief structures configured to minimize electromagnetic coupling between the cavity and the balls of the BGA, each layer of the multi-layer relief structures having an opening. The method still further includes, for each multi-layer relief structure, at least one of: configuring the size of the opening of a top layer to be less than the size of the openings of the remaining layers, or adding conducting structures to at least the top layer to further decrease the electromagnetic coupling with the cavity.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

To facilitate understanding, identical reference numerals have been used, where possible, to designate identical elements that are common to the figures. It is contemplated that elements of one embodiment may be beneficially incorporated in other embodiments.

DETAILED DESCRIPTION

Various features are described hereinafter with reference to the figures. It should be noted that the figures may or may not be drawn to scale and that the elements of similar structures or functions are represented by like reference numerals throughout the figures. It should be noted that the figures are only intended to facilitate the description of the features. They are not intended as an exhaustive description of the claimed invention or as a limitation on the scope of the claimed invention. In addition, an illustrated example need not have all the aspects or advantages shown. An aspect or an advantage described in conjunction with a particular example is not necessarily limited to that example and can be practiced in any other examples even if not so illustrated or if not so explicitly described.

As used herein, the term "substantially" means "approximately equal to" or "approximately equal to, within prototyping or manufacturing tolerances and variations." Thus a "substantially rectangular" structure need not have two sets of precisely parallel sides, and need not have four right angles as its corners. In general, an element, structure or other metric may be within +/−10% of an ideal value, and still be understood as "substantially equal" to that value.

In one or more examples, a structure including a BGA relief structure or void may be provided on multiple layers. In one or more examples, a progressive opening size in the vertical direction may be utilized in such a relief structure below a thick core in order to reduce high frequency coupled energy into the thick core. Further, in one or more examples, one or more conducting structures may be provided on top of a multi-layer relief structure to reduce core coupled energy, but at the same time keep fringe capacitance to a corresponding BGA ball low.

Thus, according to one or more examples, denser and less costly chip packages, e.g., using thick cores, may be provided than would otherwise be possible.

As noted above, as signal frequencies increase there is an additional coupling mechanism that detrimentally induces noise. This high frequency coupled energy has been shown in lab data to reduce eye margin by multiple percentage points of an eye width at 28 Gbps. As more complex packages are used for signal frequencies at 56 Gbps, 112 Gbps or more, this effect will only increase the noise and energy coupled to the core.

Thus, at these higher speeds the thick core gap begins to look more like a cavity resonator with a height dimension equal to $\lambda/8$ or $\lambda/4$. This cavity structure allows energy to travel laterally in the resonant cavity. In most packages, the relief structures or voids are located periodically in a given BGA field. As a result, an amplification effect can occur at higher speeds due to the regular placement of points where an injection of energy occurs. The location of these points is determined by industry standard BGA ball pitch options, and due to bailout nature, pairs of voids become a regular resonant structure. Parallel plate modes are generated when high frequency energy passes through vias. The larger feature size of core vias cause higher energy coupling than the thin dielectric layers. A substrate having thin build-up layers may have a thickness of 25 microns, while the core region of the substrate may be 800-1200 microns thick. At 50-100 GHz, this thick core area will start to look like a cavity resonator with a height dimension equal to ⅛ or ¼ wavelengths. At such feature sizes, the parallel plate modes readily propagate laterally. This lateral propagation reaches the relief area and can act as a source of aggressor noise.

Figure 1:
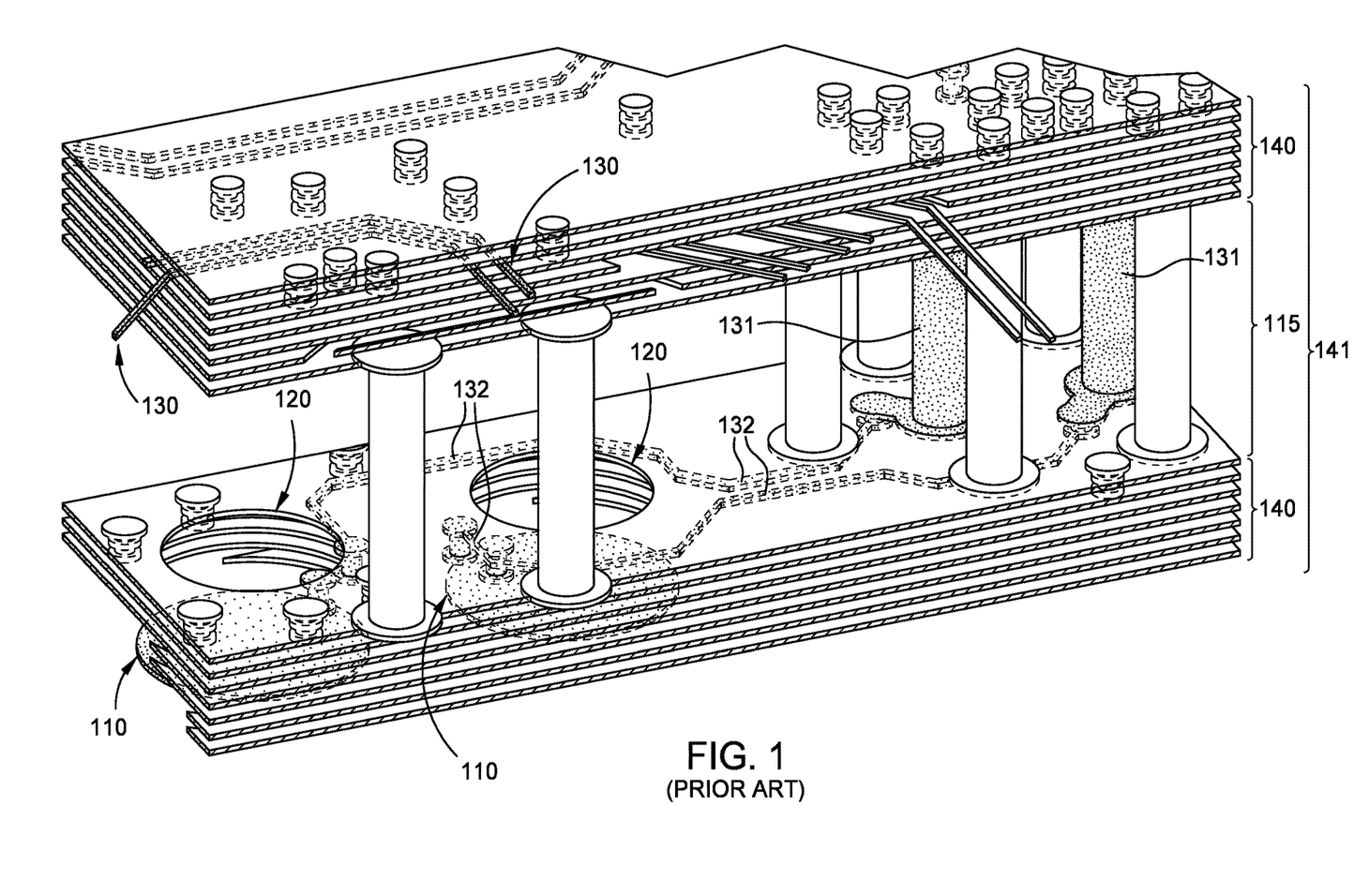
FIG. 1 illustrates a perspective side view of a portion of an example substrate having a thick core region suitable for use in a chip package.

FIG. 1 illustrates a perspective side view of a portion of an example conventional substrate having a thick core region of an example chip package. With reference to FIG. 1 there is shown a substrate 141 with build-up layers 140 above and below a thick core region 115. The build-up layers 140 include metal and dielectric layers in which conductive routing is formed. The core region 115 is generally formed from silicon, glass reinforced plastic or other rigid dielectric material. Conductive vias are formed through the core region 115 to connect the conductive routing of the build-up layers 140 formed on either side of the core region 115. At the bottom of the substrate 141 underneath which there is a BGA. Two example balls 110 (shown only as discs below the substrate) are provided beneath substrate 141, under the depicted openings or voids in substrate 141. Above the balls 110 are provided conventional multi-layer relief structures 120 which together comprise the void. Each layer of the multi-layer relief structure has an opening, and together these respective openings form the void above a ball of the BGA. This example package may be referred to as an 7-2-7 package, where the build-up layers 140 has seven layers, the substrate has seven layers and the thick core is counted as two layers. Alternate packages may be in an 8-2-8 layout, for example, with eight build-up layers 140 on top and on the bottom of the thick core region 115.

Continuing with reference to FIG. 1, there is further shown a differential signal pair 130 provided in the build-up layer 140. There are also shown nine vias, drawn as cylindrical columns, between the build-up layers 140 that vertically traverse the thick core region 115. In the example of FIG. 1, all the depicted vias are grounded, except for the two vias 131 at the right side of the figure that carry the differential signal pair from the build-up layers 140. These link to differential signals 132, which electromagnetically couple to the two multi-layer relief structures 120 provided above each of BGA balls 110 (shown as discs). In the example of FIG. 1, the multi-layer relief structures 120 have an opening in each of the layers of the substrate, and this opening is the same size in each layer.

Figure 2:
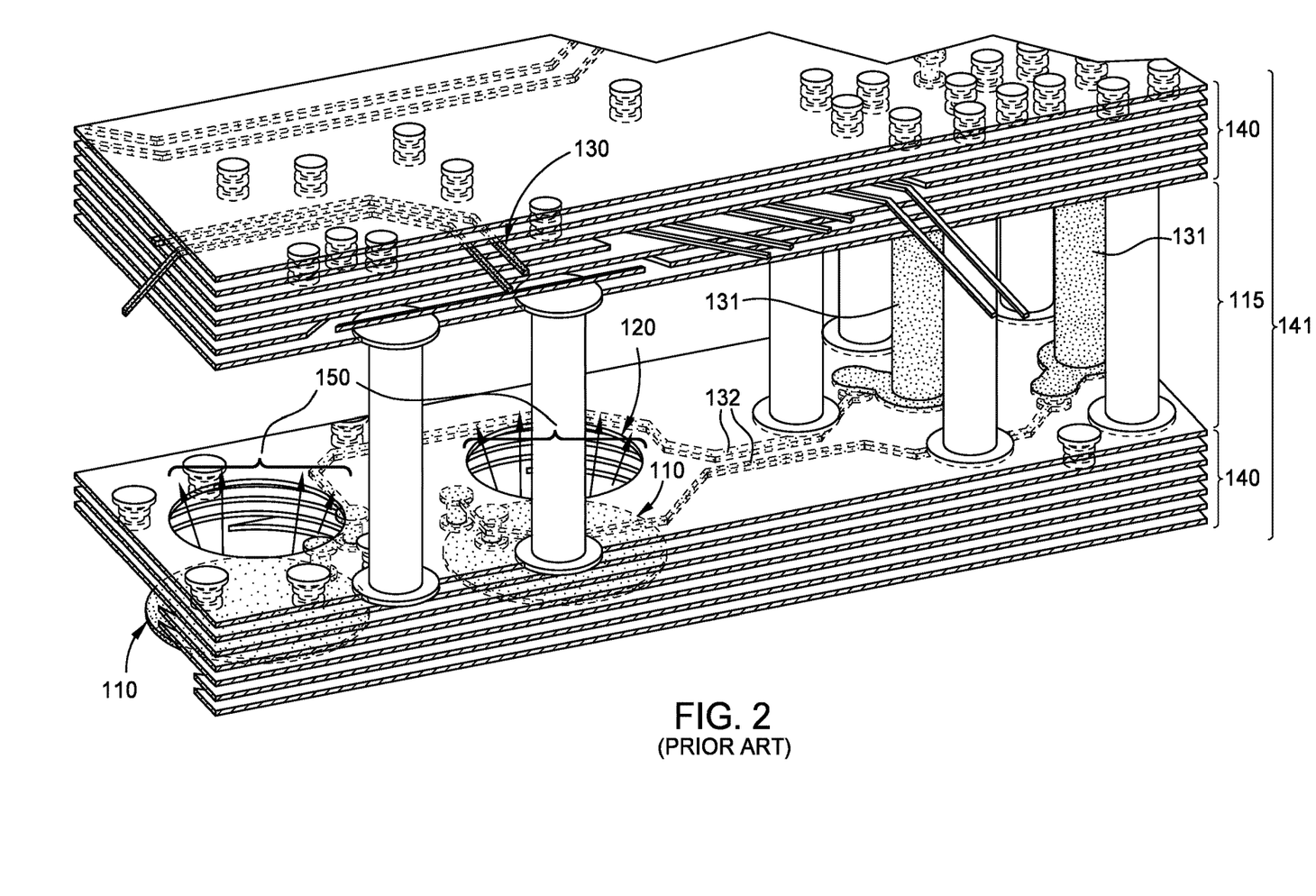
FIG. 2 illustrates the perspective side view of FIG. 1, further illustrating high frequency electromagnetic energy leaking from the multi-layer relief structures into the thick core region.

FIG. 2 illustrates the perspective side view of FIG. 1, further illustrating high frequency electromagnetic energy 150 leaking from the multi-layer relief structures into the thick core region. As is known by those skilled in the art, electromagnetic coupling is reciprocal, and thus, although in FIG. 2 the high frequency electromagnetic energy 150 is shown as leaking into the cavity, by the same token, high frequency electromagnetic energy 150 also leaks out of the cavity, and couples to balls of the BGA below. The problem with this leakage of high frequency electromagnetic energy 150 is that it may enter the cavity from a first signal, e.g., that may be carried on the one of the pair of balls 110, into the cavity of thick core region 115, and then travel transversely along the cavity, the cavity acting as a waveguide as noted above, and then from the cavity into another multi-layer relief structure of a second, unrelated signal net, and into a second ball (not shown) carrying its own signal, unrelated to the first signal. This results in inter-signal interference, and weakens any second "victim" ball receiving the electromagnetic energy from the first "aggressor" ball.

Figure 3:
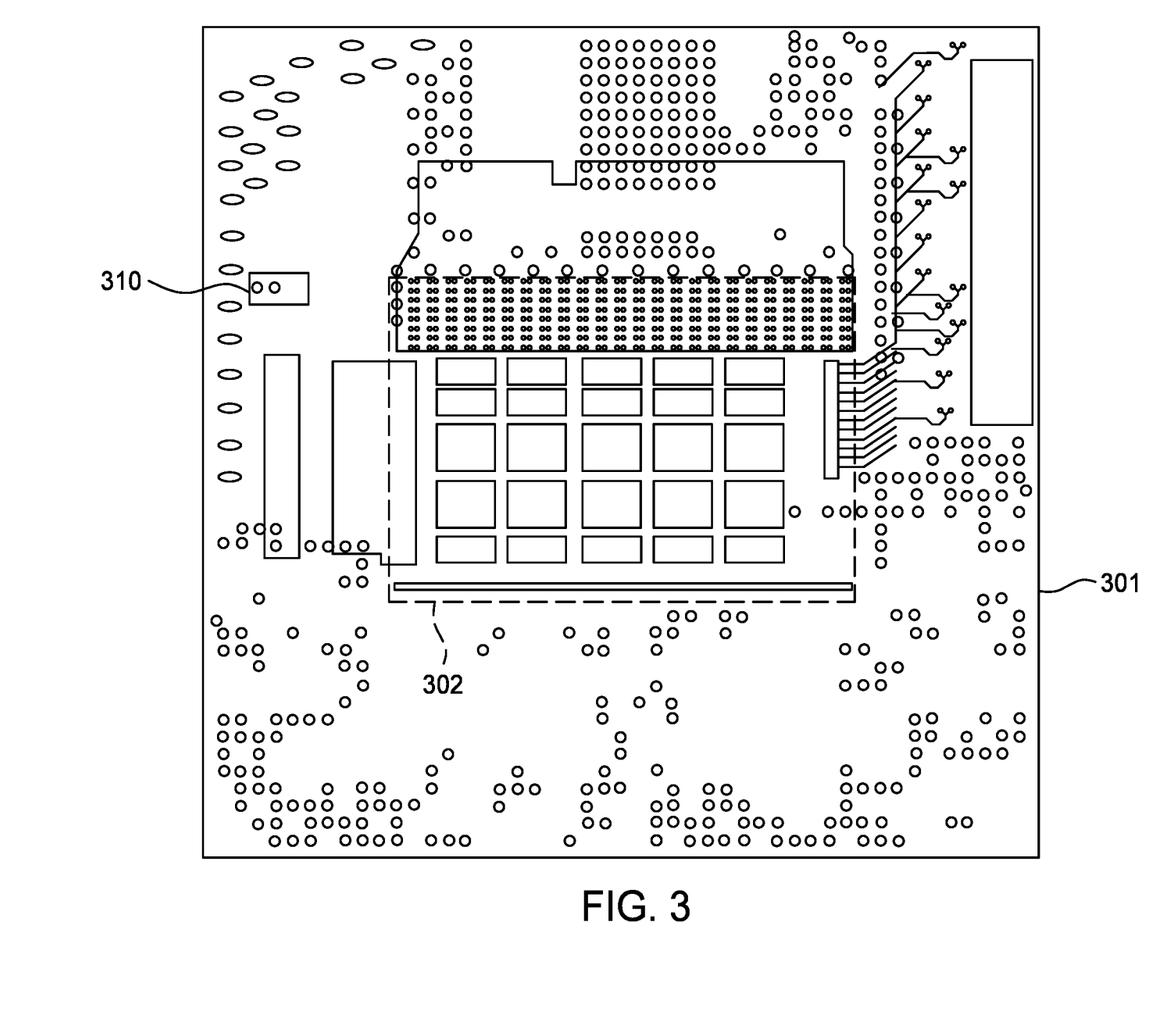
FIG. 3 is a top view of an example package substrate, and a portion of that which is illustrated in FIGS. 1 and 2.

FIG. 3 is a top view of an example package substrate 301, and a portion 310 of that package substrate 301 which is illustrated as the substrate 141 in FIGS. 1 and 2. For example, the portion 310 may include several repeated signal nets, and thus several pairs of multi-layer relief structures provided above corresponding pairs of BGA balls. In the particular example of FIG. 3, a die 302 (shown in phantom) mounted to the package substrate 301 is a memory controller interface for a DDR5 memory. The portion 310 of the package substrate 301 includes several 100 Gbs serializer/deserializer (SERDES) blocks.

Figure 4A:
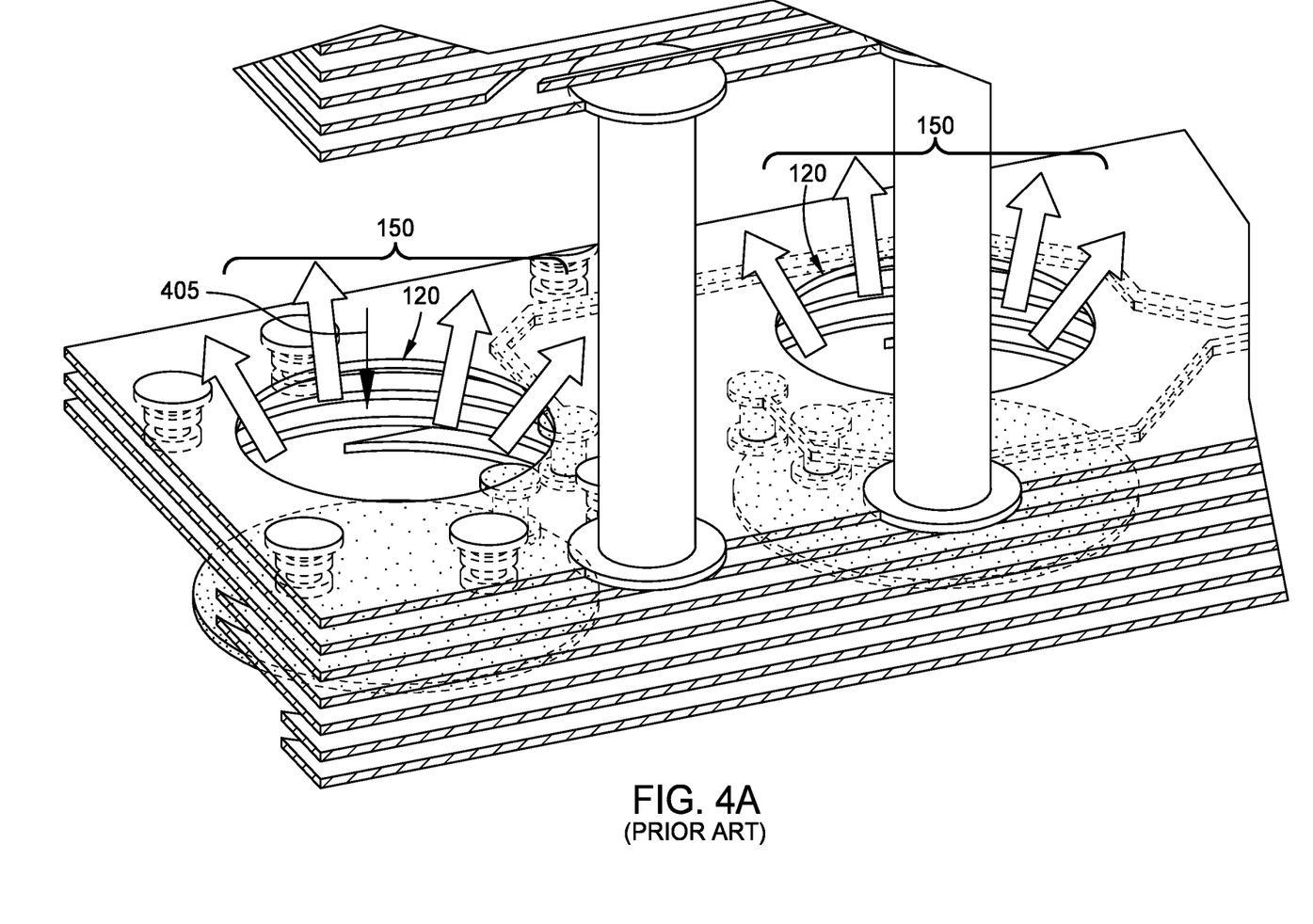
FIG. 4A is a magnified view of the two relief structures shown in FIGS. 1 and 2, showing a point of view to be used in subsequent figures.

FIG. 4A is a magnified view of the two multi-layer relief structures 120 shown in FIGS. 1 and 2, showing the high frequency electromagnetic energy 150 that leaks into the cavity and manifests as noise, as well as a point of view 405 into the relief structure that will be referred to in various descriptions provided below.

Figure 4B:
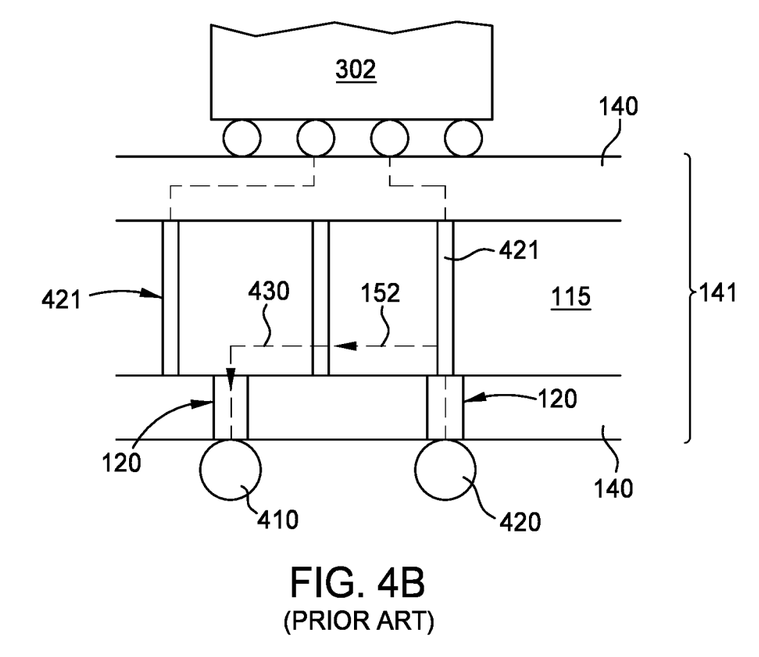
FIG. 4B is a two dimensional side view showing two adjacent ball pairs of a BGA and a coupling path between them.

FIG. 4B is a two dimensional side view of an example package showing noise generation at high frequencies occurs. With reference thereto, there is shown an aggressor ball 420 that receives a signal from its associated core via 421, the signal originating in a die 302 mounted to the build-up layer 140. In this example rendering, two balls 410, 420 are shown coupled to the build-up layer 140 opposite the core region 115. A signal, such as a 112 Gbps SERDES signal originating at the die 302 or other circuit coupled to the substrate 141 may be routed through the TX aggressor core via 421 to TX aggressor ball 420. However, as shown, TX aggressor ball 420 may leak some high frequency electromagnetic energy 152 from the signal back into the thick core region 115, which then travels transversely along the dashed arrow, over to an adjacent ball, RX victim ball 410, via coupling path 430 from the cavity into the multi-layer relief structure 120 above RX victim ball 410. This energy is noise at RX victim ball 410, and also degrades the strength of the signal at TX aggressor ball 420. In one or more examples, this leaked energy may be mitigated using a different and novel multi-layer relief structure instead of the convention multi-layer relief structure 120 described above. Moreover, the novel multi-layer relief structure according to one or more examples described as follows do not require any change in the height of the thick core region 115, or any adjustment or change of where the balls of the BGA are provided (which would require increasing the area of the die). The novel multi-layer relief structures that reduce the energy induced to the core region 115 of the substrate are next described with reference to FIGS. 5-8.

Figure 5A:
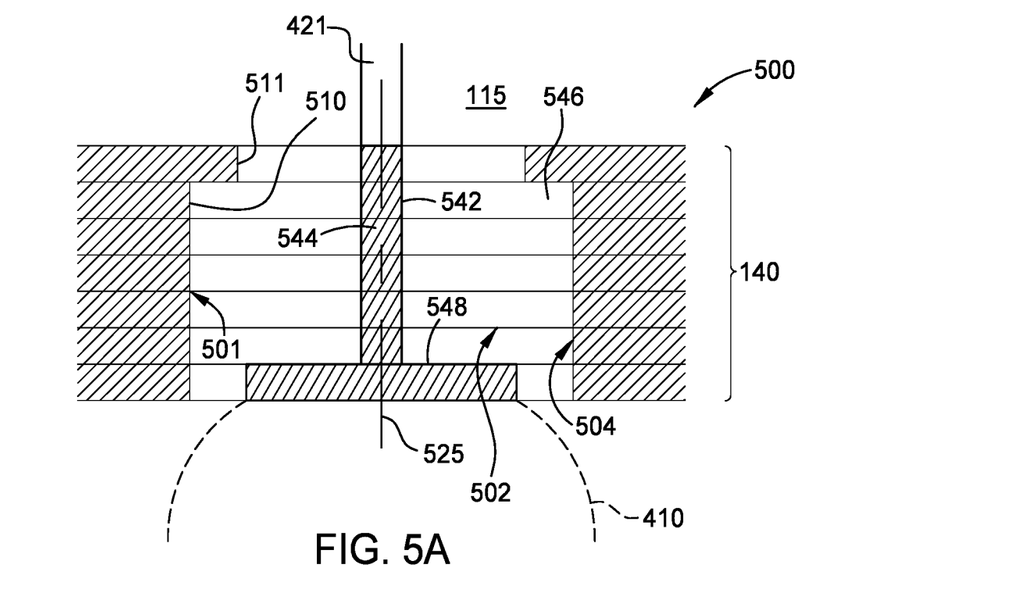
FIG. 5A is a side view of an example novel multi-layer relief structure, according to an example.

In one or more embodiments, various approaches may be used to mitigate energy leaking from a multi-layer relief structure into a thick core cavity. These include, for example, reducing the size of an opening of one or more build-up layers, or, for example, changing the area of the opening formed in the build-up layers by adding additional structures in one or more of the build-up layers so as to reduce leakage into the cavity, but still allowing for low capacitance to the BGA ball. There is a balance between removing the relief area fully and causing too much return loss/mismatch at 3D via structure including substrate and ball. Fully removing the relief area will cause high return loss, mismatch, and/or reflection, which is undesirable. The incursions into relief area that do not fully close to minimal anti-pad geometry enables the signal to have higher coupling isolation and low return loss simultaneously FIG. 5A is a side view of an example multi-layer relief structure 501 formed in a substrate 500, according to an example. The substrate 500 is fabricated as described above with reference to the substrate 141, except wherein at least some or all of the multi-layer relief structures 120 are replace with one or more of the multi-layer relief structure 501 described below. With reference to FIG. 5A, the substrate 500 includes a core region 115 disposed over a build-up layer 140 that is configured to couple to the BGA. The build-up layer 140 on the opposite side of the core region 115 that is configured to couple to the die 302 is not shown in FIG. 5A. In the example depicted in FIG. 5A, the multi-layer relief structure 501 formed in the build-up layer 140 is comprised of metal layers shown by hatching. It is understood that dielectric layers of the build-up layer 140 separate each of the metal layers to prevent shorting. An example void 502 of the multi-layer relief structure 501 is defined by the edges 504 of the metal layers of the build-up layers 140. The build-up layers 140 may include any number of layers, seven metals layers of which are illustrate in FIG. 5A. The void 502 is filled with dielectric material 546. The void 502 may be symmetrical about a central axis 525 of the multi-layer relief structure 501. The sectional area of the void 502 is not constant across different regions of the multi-layer relief structure 501. For example, the sectional area of the void 502 may be smaller in at least one region closer to the core region 115 relative to the sectional area where the void 502 opens at the layer farthest from the core region 115. In another example, the sectional area of the void 502 is smaller through a metal layer of the build-up layers 140 that is closest to the core region 115. Thus, as shown, the uppermost (e.g., top metal) layer 511 of the build-up layers 140 closest to the core region 115 is narrower than the remaining metal layers 510. In one example, the uppermost layer 511 of the build-up layers 140 closest to the core region 115 is at least half as wide as at least one or all the remaining layers 510. In one or more alternate examples, for an N layer structure, the uppermost M layers may all have a narrowed opening of a first diameter, and the bottom N-M layers may all have a wider opening of a second diameter. For example, continuing with reference to FIG. 5A, the top three layers may have the same opening width as top layer 511, and the bottom N-3 layers the same opening width as shown for the bottom layer in FIG. 5A. Various additional combinations are possible, and all within the teachings of this disclosure.

In one example, the void 502 of the multi-layer relief structure 501 is aligned with a via 421 formed through the core region 115. A routing trace 544 is formed in the void 502 and spaced by the dielectric material 546 from the edges 504 of the metal layers of the multi-layer relief structure 501. The routing trace 544 may be formed in the void 502 using a number of suitable, one of which is by laser drilling holes 542 in the layers of dielectric material 546, and filling the holes 542 with copper or other electrically conductive material to form the routing trace 544. One end of the routing trace 544 is connected to the via 421 while a second end of the routing trace 544 is coupled to a contact pad 548 formed in the void 502. The solder ball 410 (shown in phantom in FIG. 5A) is mechanically and electrically connected to the contact pad 548. The diameter of the contact pad 548 is less than (and spaced inward from) the edge 504 of the bottom metal layer of the multi-layer relief structure 501. Additionally, the diameter of the solder ball 410, while contacting the contact pad 548 and not contacting the edge 504 of the bottom metal layers of the multi-layer relief structure 501, is larger than both the diameter of the contact pad 548 and the diameter of the void 502.

Figure 5B:
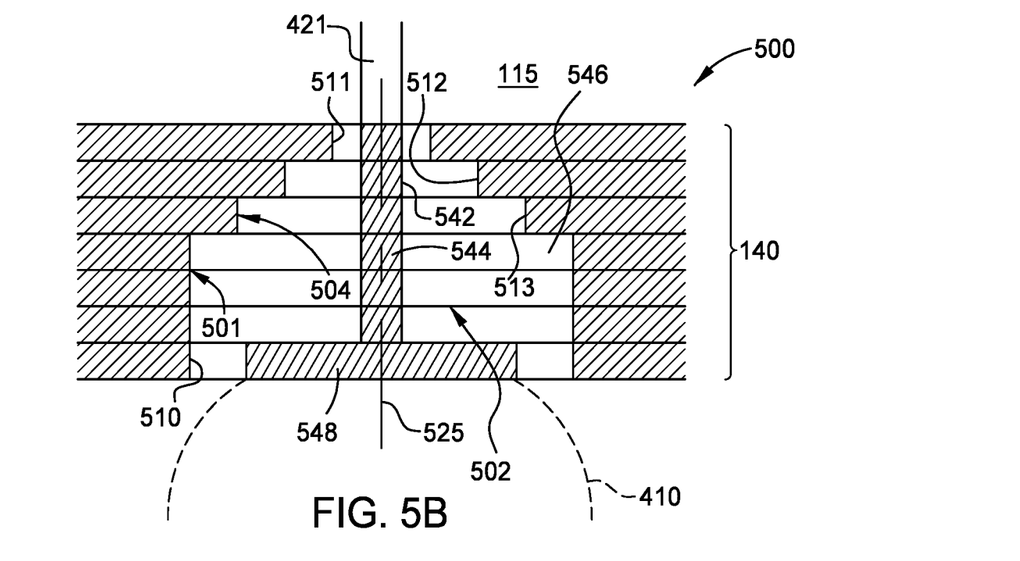
FIG. 5B is a side view of an alternate example novel multi-layer relief structure, according to an example.

FIG. 5B is a side view of an alternate example novel multi-layer relief structure 501 of a substrate 500, according to an example. Similar to the example depicted in FIG. 5A, the multi-layer relief structure 501 of FIG. 5B formed in the build-up layer 140 is comprised of metal layers shown by hatching. It is understood that dielectric layers of the build-up layer 140 separate each of the metal layers to prevent shorting. The trace routing 544 formed in the void 502 of the multi-layer relief structure 501 of FIG. 5B can be fabricated as described above with reference to FIG. 5A.

In the example depicted in FIG. 5B, a width or sectional area progression from a top metal layer 511 of the build-up layers 140 to the bottom of the build-up layer 140 is tapered. For example, the top metal layer 511 of the build-up layers 140 is shown with a first width (which, in this example, is the same as the top layer 511 of FIG. 5A), a second layer 512 with a slightly larger width, a third layer 513 with a slightly larger width, and then the remaining layers 510 each having a widest width. The edges 504 of the build-up layers 140 thus define a tapered or progressively narrowing void 502 of the multi-layer relief structure 501. In a case of highest density of signals with minimal distance between the widths, higher capacitance/coupling to BGA ball and slightly higher return loss can be realized. To balance the density and spacing, limiting the encroachment into the relief are will reduce the additive return loss.

Figure 5C:
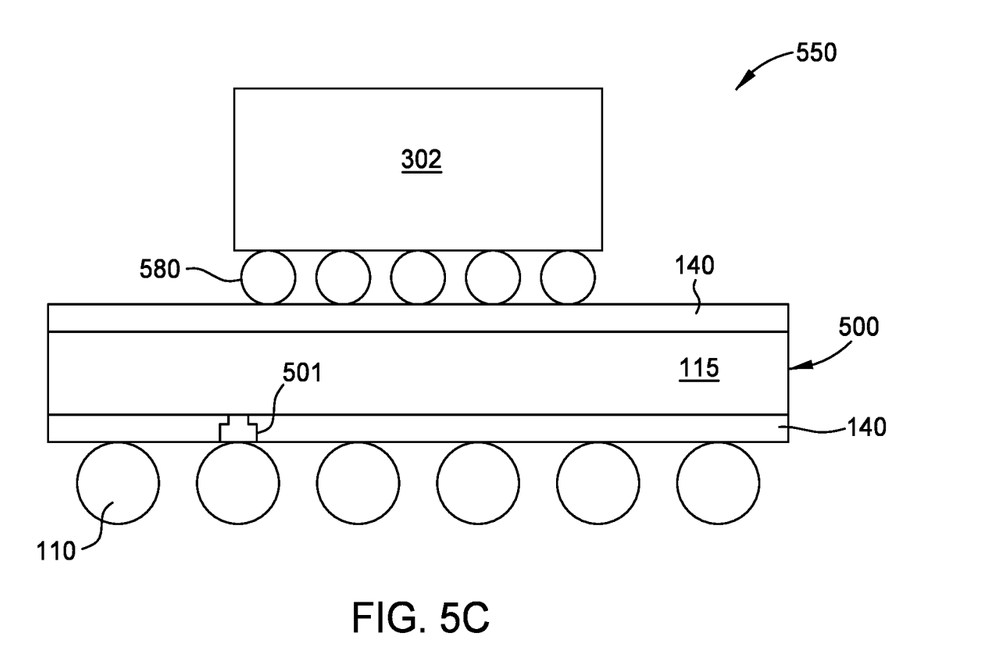
FIG. 5C is an example chip package having a novel multi-layer relief structure.

FIG. 5C is an exemplary schematic side view of a chip package 550 that include one or more multi-layer relief structures 501. The chip package 550 includes at least one integrated circuit (IC) die 302 mounted to a substrate 500. Although one IC die 302 is shown in FIG. 5C, multiple dies disposed side by side and/or stacked on the substrate 500. The IC die 302 is coupled to the routing circuitry formed in the upper build-up layer 140 of the substrate 500 by solder or other suitable connections 580. The routing circuitry formed in the upper build-up layer 140 is coupled through vias formed in the core region 115 and the routing circuitry formed in the lower build-up layer 140 to the solder balls 110 of the BGA. As discuss above, the substrate 500 include one or more multi-layer relief structures 501 that reduces the energy coupled to the core region, thus improving the speed and performance of the chip package 550.

Figure 6A:
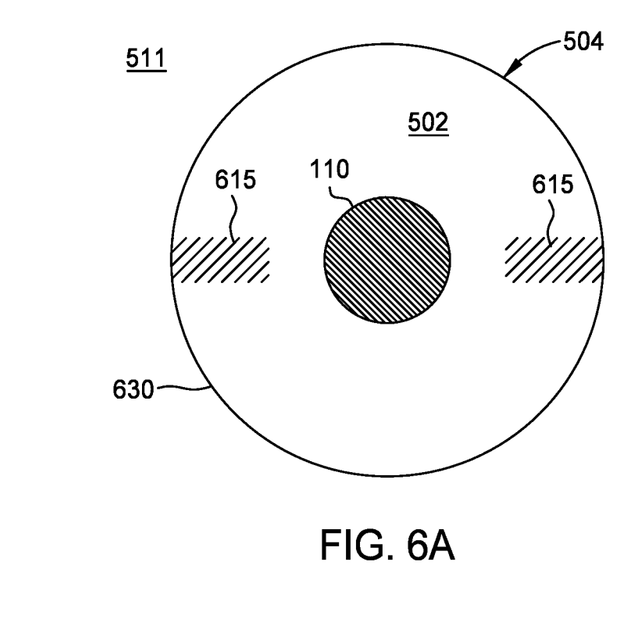
FIG. 6A is a top view of a first layer of an example novel multi-layer relief structure, with a first version of example metal incursions, according to an example.
Figure 6B:
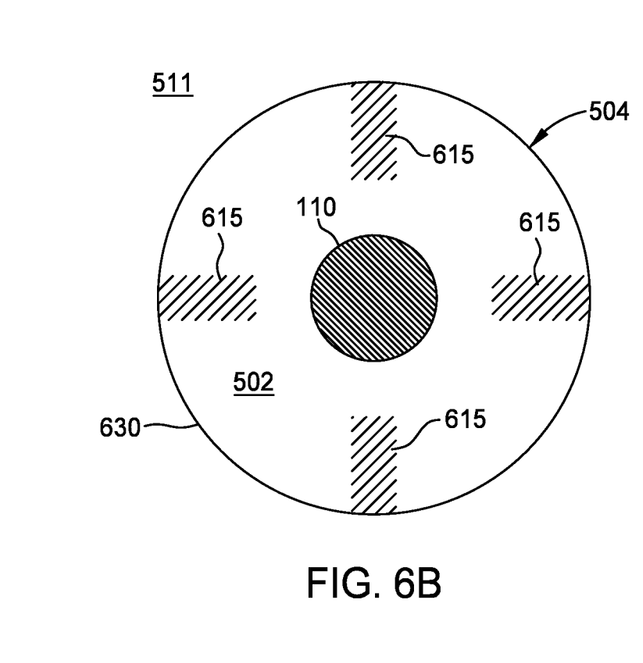
FIG. 6B is a top view of a first layer of an example novel multi-layer relief structure, with a second version of metal incursions, according to an example.

Another approach to reduce core coupled energy, but also keep fringe capacitance to the BGA ball low, is to utilize patterns on top of the multi-layer relief structure to reduce the sectional area of one region of the void forming the relief structure. FIGS. 6A and 6B illustrate this approach that blocks energy at upper opening without fully reducing of annular ring, which will have even less impact on return loss than the examples discussed above with reference to FIG. 5A-5B, while still blocking most of the coupled energy. The multi-layer relief structures of FIGS. 6A and 6B may be utilized in the substrate 500 and the chip package 550 described above in addition or as an alternative to the multi-layer relief structures 501.

FIG. 6A is a top view of a first layer 511 closest the core region 115 of a build-up layer 140 of an example multi-layer relief structure 630, with a first version of example metal incursions 615, according to an example. With reference to FIG. 6A, the view shown is one down into the multi-layer relief structure 630, and is, for example, analogous to the view indicated at 405 in FIG. 4A. Shown in FIG. 6A is the outer perimeter (e.g., the edges 504 of the void 502) of relief structure 630, and the top of ball 110 visible in the center of the void 502. The via (not shown) is stacked above the ball 110. The metal incursions 615 extend into the void 502, thus reducing the sectional area of the multi-layer relief structure 630 at the first layer 511, as compared to at least one or more of the other layers 510 forming the relief structure 630 that do not include metal incursions 615 extending into the void 502 from the edges 504 of the layers 510. The layers 510 are not shown in FIG. 6A, but are similarly shown in FIG. 5A. There are further provided metal incursions 615, which are conducting structures that connect to a layer of the build-up layer 140 of the multi-layer relief structure 630 and protrude within the opening (e.g., void 502) of one or more layers of the build-up layer 140 forming the multi-layer relief structure 630. The metal incursions 615 do not decrease the size of the opening, e.g., diameter, but do decrease the overall sectional area. In one or more examples, metal incursions 615 may be substantially rectangular conducting structures, made out of the same metal as the layer of the associated build-up layer 140 in which the multi-layer relief structure 630 is at least partially formed. In one or more examples, metal incursions 615 may be equidistantly spaced around the inner perimeter of the opening in multi-layer relief structure 630. In one or more other examples, metal incursions 615 may be non-equidistantly spaced and/or asymmetrically spaced around the inner perimeter of the opening in multi-layer relief structure 630. The metal incursions 615 can also be present one or more of the layers 510, with the sectional area of through at least one of the layers 510, 511, and in one example the top layer 511, be less than at least one of the layers 510. In one or more examples, the top layer 511 alone, or a set of uppermost layers, may be provided with the metal incursions 615. In one or more examples, the portion of the void 502 in a given layer is fabricated so as to leave the metal incursions 615 in the metal layer.

FIG. 6B is a top view of a first layer 511 of another example multi-layer relief structure 630, with a second version of metal incursions 615, according to an example. With reference to FIG. 6B, in this alternate example there is at least three or more metal incursions 615, as opposed to two incursions 615 shown in the example of FIG. 6A. In FIG. 6A, a four metal incursions 615 are shown extending from the edges 504 of the layer 511 into the void 502 forming a portion of the multi-layer relief structure 630.

In one or more examples, additional patterns or designs of conductive structures may be provided to further reduce core coupled energy while maintaining fringe capacitance to a BGA ball low. These are next described with reference to FIGS. 7A and 7B. The multi-layer relief structures of FIGS. 7A and 7B may be utilized in the substrate 500 and the chip package 550 described above in addition or as an alternative to the multi-layer relief structures 501 and/or 630.

Figure 7A:
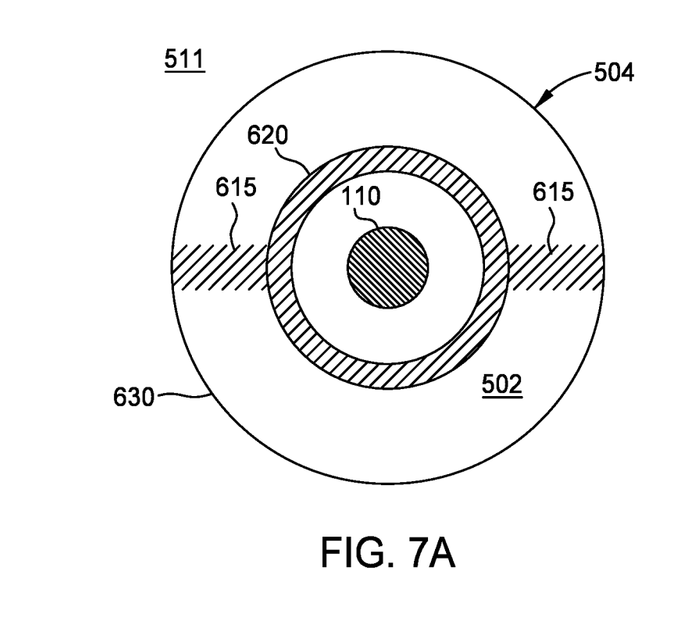
FIG. 7A is a top view of the example first layer of the example novel multi-layer relief structure of FIG. 6A, with an added annular ring, according to an example.
Figure 7B:
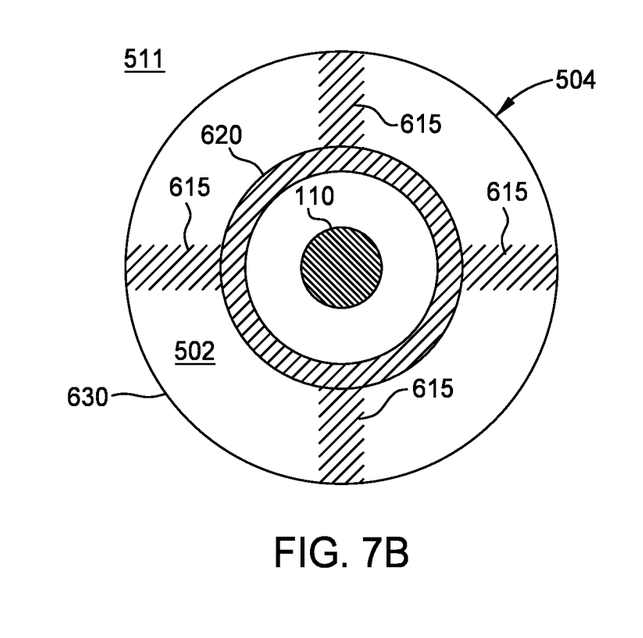
FIG. 7B is a top view of the example first layer of the example novel multi-layer relief structure of FIG. 6B, with an added annular ring, according to an example.

FIG. 7A is a top view of the example first layer 511 of the example multi-layer relief structure 630 of FIG. 6A, with an added annular ring 620, according to an example, and FIG. 7B is a top view of the example first layer 511 of the example multi-layer relief structure 630 of FIG. 6B, with an added annular ring 620, according to an example. The added annular rings 620 further operate to keep the electromagnetic energy in the void 502 of the relief structure 630, and thus reducing leak of electromagnetic energy into the thick core region 115. In one or more examples, a thickness of the annular rings 620 may be varied so as to target a given coupling frequency, or a desired dB of energy isolation at a desired range of signal frequencies. For example at 50 GHz, a thin annular ring 620 may be sufficient, while at 100-200 GHz, the sectional area of the annular ring 620 is generally thicker.

Figure 8:
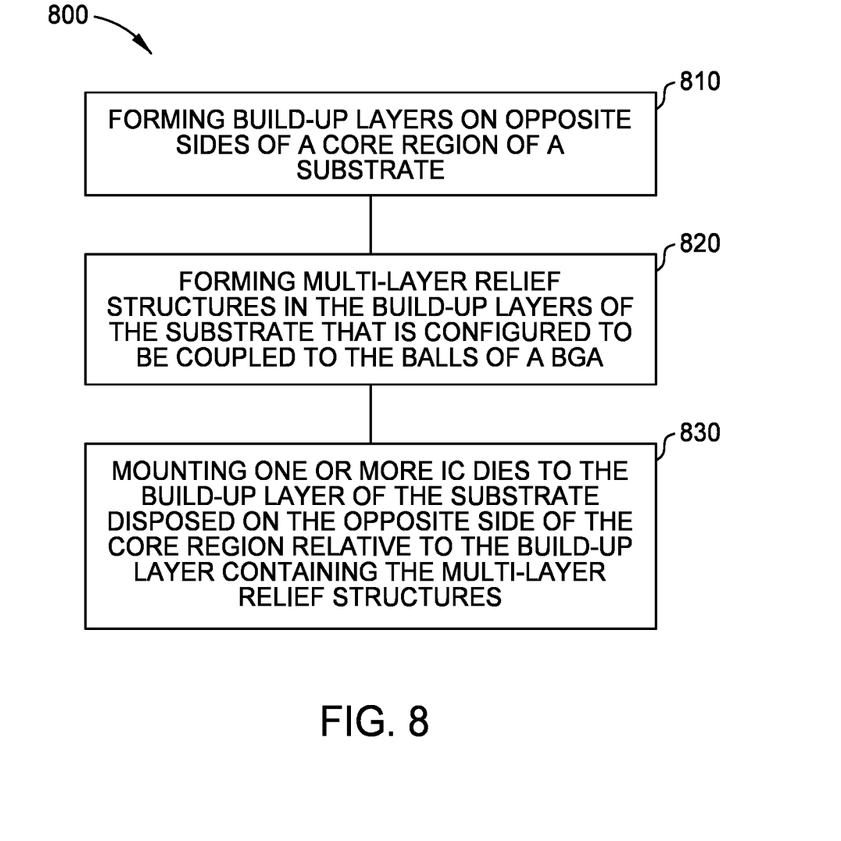
FIG. 8 is a flow diagram depicting a method of fabricating a chip package or component thereof, according to an example.

FIG. 8 is a flow diagram depicting a method of forming a chip package or component thereof, according to an example. Method 800 includes blocks 810 through 830. In alternate examples method 800 may include greater, or fewer, blocks. Method 800 begins at block 810 by forming build-up layers on a core region of a substrate. The build-up layers include routing circuitry that is connected through vias formed through a core region. For example, the substrate may be fabricated similar to that shown in FIG. 5A.

At block 820, multi-layer relief structures are formed in the build-up layer of the substrate that is configured to be coupled to the balls of the BGA. The relief structures, such as the relief structures 501, 630 described above, are configured to reduce electromagnetic coupling between the core region and the balls of the BGA. The sectional area of the void defined by the relief structures is not constant between layers. For example, the sectional area of the void defined through one or more of the layers closest the core region is less than the sectional area of the void defined through one or more of the layers farther from the core region.

At block 830, one or more IC dies are mounted to the build-up layer of the substrate disposed on the opposite side of the core region relative to the build-up layer containing the multi-layer relief structures. The IC die mounted to the substrate 500 forms the chip package 550. The chip package 550 may also include BGA balls mounted below the multi-layer relief structures 501.

While the foregoing is directed to embodiments of the present invention, other and further embodiments of the invention may be devised without departing from the basic scope thereof, and the scope thereof is determined by the claims that follow.

What is claimed is:

1. A substrate for chip package, the substrate comprising:
   a core region;
   top build-up layers formed on a first side of the core region;
   bottom build-up layers including a plurality of metal layers, the bottom build-up layers formed on a second side of the core region that is opposite the first side, routing circuitry formed in the bottom build-up layers coupled to routing circuitry formed in the top build-up layers by vias formed through the core region;
   a void formed in the bottom build-up layers, the void having sectional areas that are different at least two different distances from the core region;
   a first conducting structure comprising a routing trace connected to a contact pad, wherein the first conducting structure extends from the bottom build-up layers into the void; and
   dielectric material filling an interstitial space defined between the routing trace and the contact pad of the first conducting structure and sidewalls of the void.

2. The substrate of claim 1, wherein the bottom build-up layers include a top layer that is closer to the core region than other bottom build-up layers, a sectional area of the void at the top layer smaller than sectional areas of the void at the other layers of the bottom build-up layers.

3. The substrate of claim 1, wherein bottom build-up layers include two or more layers closer to the core region than other bottom build-up layers, the void in each of the two or more layers having a sectional area that is smaller than sectional areas of the void at the other bottom build-up layers.

4. The substrate of claim 3, wherein the sectional areas of the void at each of the two or more layers closer to the core region are different.

5. The substrate of claim 1, wherein the routing trace of the first conducting structure extends into the void from a top layer of the bottom build-up layers that is closest to the core region.

6. The substrate of claim 1 further comprising:
   a central annular ring disposed in the void and coupled to the first conducting structure extending into the void.

7. The substrate of claim 1 further comprising:
   a second conducting structure extending into the void from the same bottom build-up layer as the first conductive structure.

8. The substrate of claim 1 further comprising:
   a solder ball coupled to the contact pad and aligned with the void.

9. A chip package comprising:
   an integrated circuit (IC) die;
   a substrate having top and bottom build-up layers disposed on opposite sides of a core region, the bottom build-up layers including a plurality of metal layers, the substrate having a void formed in the bottom build-up layers, the void having sectional areas that are different at least two different distances from the core region;
   a first conducting structure comprising a routing trace connected to a contact pad, wherein the first conducting structure extends from the bottom build-up layers into the void; and
   dielectric material filling an interstitial space defined between the routing trace and the contact pad of the first conducting structure and sidewalls of the void.

10. The chip package of claim 9, wherein the bottom build-up layers include a top layer that is closer to the core region than other bottom build-up layers, a sectional area of the void at the top layer smaller than sectional areas of the void at the other layers of the bottom build-up layers.

11. The chip package of claim 9, wherein the bottom build-up layers include two or more layers closer to the core region than other bottom build-up layers, the void in each of the two or more layers having a sectional area that is smaller than sectional areas of the void at the other bottom build-up layers.

12. The chip package of claim 11, wherein the sectional areas of the void at the two or more layers closer to the core region are different.

13. The chip package of claim 9, wherein the first conducting structure extends into the void from a top layer of the bottom build-up layers that is closest to the core region.

14. The chip package of claim 9 further comprising:
   a central annular ring disposed in the void and coupled to the first conducting structure extending into the void.

15. The chip package of claim 9 further comprising:
   a second conducting structure extending into the void from the same bottom build-up layers as the first conductive structure.

16. The chip package of claim 9 further comprising:
   a solder ball coupled to the contact pad and aligned with the void.

17. A method for forming a chip package or component thereof, the method comprising:
   forming build-up layers on opposite sides of a core region of a substrate; and forming multi-layer relief structures in the build-up layers of the substrate that is configured to be coupled to balls of a ball grid array, at least a first multi-layer relief structure of the multi-layer relief structures having sectional areas that are different, the first multi-layer relief structure includes a first conducting structure extending into the multi-layer relief structure and a dielectric material filling an interstitial space defined between the first conducting structure and sidewalls of the first multi-layer relief structure; and mounting one or more IC dies to the build-up layers of the substrate disposed on an opposite side of the core region relative to the build-up layer containing the multi-layer relief structures.

\* \* \* \* \*